United States Patent
Hattori et al.

(10) Patent No.: US 9,548,373 B2
(45) Date of Patent: Jan. 17, 2017

(54) NONVOLATILE SEMICONDUCTOR MEMORY DEVICE

(71) Applicant: Kabushiki Kaisha Toshiba, Minato-ku (JP)

(72) Inventors: Shigeki Hattori, Kawasaki (JP); Tsukasa Tada, Hachioji (JP); Masaya Terai, Kawasaki (JP); Hideyuki Nishizawa, Toshima (JP); Koji Asakawa, Kawasaki (JP); Yoshiaki Fukuzumi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/842,312

(22) Filed: Sep. 1, 2015

(65) Prior Publication Data
US 2016/0087067 A1 Mar. 24, 2016

(30) Foreign Application Priority Data

Sep. 19, 2014 (JP) ................. 2014-190931

(51) Int. Cl.
*H01L 29/51* (2006.01)
*G11C 11/56* (2006.01)
(Continued)

(52) U.S. Cl.
CPC ......... *H01L 29/518* (2013.01); *G11C 11/5664* (2013.01); *H01L 27/285* (2013.01); *H01L 29/511* (2013.01); *H01L 29/517* (2013.01); *H01L 51/0091* (2013.01); *H01L 51/0591* (2013.01)

(58) Field of Classification Search
None
See application file for complete search history.

(56) References Cited

U.S. PATENT DOCUMENTS

| 6,198,655 B1 | 3/2001 | Heath et al. |
| 6,873,540 B2 | 3/2005 | Krieger et al. |

(Continued)

FOREIGN PATENT DOCUMENTS

| JP | 2003-516602 | 5/2003 |
| JP | 2008-53631 | 3/2008 |

(Continued)

OTHER PUBLICATIONS

Sanaz Kabehie, et al., "Surface Immobilized Heteroleptic Copper Compounds as State Variables that Show Negative Differential Resistance," *The Journal of Physical Chemistry Letters*, (2010), 1, pp. 589-593.

*Primary Examiner* — Julio J Maldonado
*Assistant Examiner* — Stanetta Isaac
(74) *Attorney, Agent, or Firm* — Oblon, McClelland, Maier & Neustadt, L.L.P.

(57) ABSTRACT

A nonvolatile semiconductor memory device according to an embodiment includes: a semiconductor layer; a control gate electrode; and an organic molecular layer, which is provided between the semiconductor layer and the control (Continued)

gate electrode, and has organic molecules including a molecular structure described by a molecular formula (1).

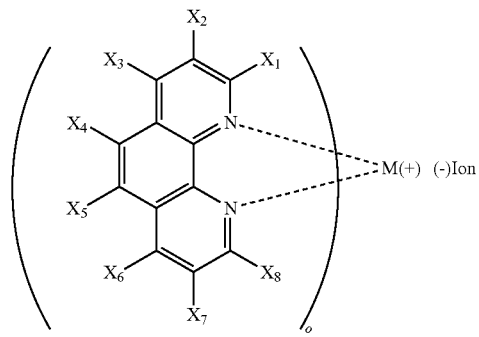

(1)

20 Claims, 8 Drawing Sheets

(51) Int. Cl.
*H01L 51/05* (2006.01)
*H01L 51/00* (2006.01)
*H01L 27/28* (2006.01)

(56) References Cited

U.S. PATENT DOCUMENTS

| | | | |
|---|---|---|---|
| 7,067,349 B1 * | 6/2006 | Buynoski | B82Y 10/00 257/427 |
| 2002/0163831 A1 | 11/2002 | Krieger et al. | |
| 2002/0170594 A1 | 11/2002 | Arakawa et al. | |
| 2003/0111670 A1 | 6/2003 | Misra et al. | |
| 2008/0191256 A1 | 8/2008 | Bidan et al. | |
| 2009/0230449 A1 | 9/2009 | Sakaguchi et al. | |
| 2010/0163108 A1 | 7/2010 | Bessho et al. | |
| 2012/0112171 A1 | 5/2012 | Hattori et al. | |
| 2012/0241713 A1 | 9/2012 | Nishizawa et al. | |
| 2013/0248962 A1 | 9/2013 | Morota et al. | |
| 2014/0008601 A1 | 1/2014 | Nishizawa et al. | |

FOREIGN PATENT DOCUMENTS

| | | |
|---|---|---|
| JP | 2009-81444 | 4/2009 |
| JP | 2009-218283 | 9/2009 |
| JP | 2012-104675 | 5/2012 |
| JP | 2012-204433 | 10/2012 |
| JP | 2012-204434 | 10/2012 |
| JP | 2013-197363 | 9/2013 |
| WO | WO 2006/031260 A2 | 3/2006 |

* cited by examiner

NONVOLATILE SEMICONDUCTOR MEMORY DEVICE

CROSS-REFERENCE TO RELATED APPLICATION

This application is based upon and claims the benefit of priority from Japanese Patent Application No. 2014-190931, filed on Sep. 19, 2014, the entire contents of which are incorporated herein by reference.

FIELD

Embodiments described herein relate generally to a nonvolatile semiconductor memory device.

BACKGROUND

As a method for realizing reduced bit cost of a nonvolatile semiconductor memory device and also enhancing memory performance thereof, scaling down of a memory cell is effective. However, there are increasing technical difficulties in scaling down the memory cell.

It has thus been proposed to use organic molecules for a charge storing layer of the memory cell. Because it is possible to organically synthesizing a variety of molecular structures and substituent groups, organic molecules may acquire desired electrochemical properties. And, because constitutional unit of organic molecules is small, it is possible to realize scaling-down of the memory cell by applying organic molecules.

In a nonvolatile semiconductor memory device using organic molecules for its charge storing layer, further improvement in charge retention properties is desired.

DETAILED DESCRIPTION

Figure 1:
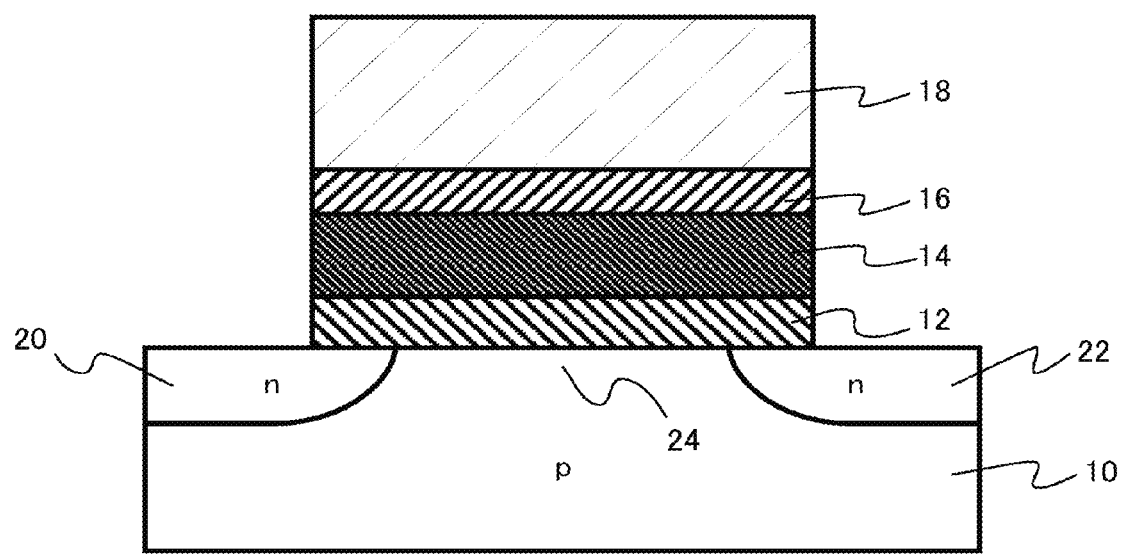
FIG. 1 is a sectional view of a memory cell unit of a nonvolatile semiconductor memory device according to a first embodiment.

A nonvolatile semiconductor memory device according to the embodiment includes: a semiconductor layer; a control gate electrode; and an organic molecular layer, which is provided between the semiconductor layer and the control gate electrode, and has organic molecule including a molecular structure described by a molecular formula (1):

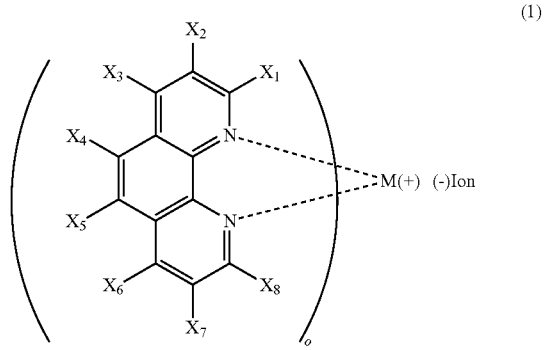

$$(1)$$

$M(+)$ in the molecular formula (1) is a positively charged metal ion selected from a group consisting of a copper ion, an iron ion, a ruthenium ion, a cobalt ion, an iridium ion, a manganese ion, a vanadium ion, a titanium ion, a zirconium ion, a silver ion and a platinum ion. o is an integer which is not smaller than 1 and changes in accordance with a kind of the metal ion. At least one of $X_1$ to $X_8$ is a chemical modified group for chemically bonding the organic molecule to a material at the semiconductor layer side or the control gate electrode side. (−) Ion is a negatively charged ion selected from a group consisting of a chlorine ion, a bromide ion, a triflate ion, a perchlorate ion, a hexafluorophosphate ion and tetrafluoroboron ion.

In the present specification, the same or similar members may be provided with the same numeral, and a repeated description may be omitted.

In the present specification, "upper" and "lower" are used for indicating the relative positional relation of a component or the like. In the present specification, concepts of "upper" and "lower" are not necessarily terms indicating relations with the gravity direction.

Hereinafter, embodiments will be described with reference to the drawings.

First Embodiment

A nonvolatile semiconductor memory device according to the present embodiment includes: a semiconductor layer; a control gate electrode; and an organic molecular layer, which is provided between the semiconductor layer and the control gate electrode, and has organic molecule including a molecular structure described by a molecular formula (1):

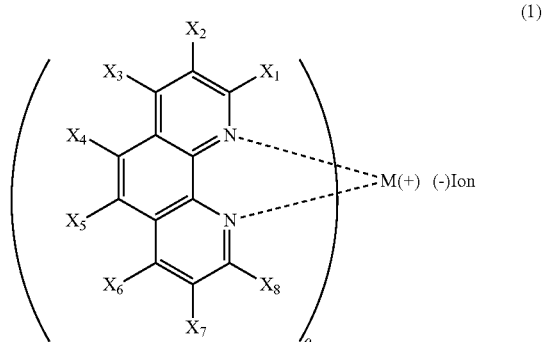

$$(1)$$

$M(+)$ in the molecular formula (1) is a positively charged metal ion selected from a group consisting of a copper ion, an iron ion, a ruthenium ion, a cobalt ion, an iridium ion, a manganese ion, a vanadium ion, a titanium ion, a zirconium ion, a silver ion and a platinum ion. o is an integer which is not smaller than 1 and changes in accordance with a kind of the metal ion. At least one of $X_1$ to $X_8$ is a chemical modified group for chemically bonding the organic molecule to a material at the semiconductor layer side or the control gate electrode side. (−) Ion is a negatively charged ion selected from a group consisting of a chlorine ion, a bromide ion, a triflate ion, a perchlorate ion, a hexafluorophosphate ion and tetrafluoroboron ion. The material that the at least one of $X_1$ to $X_9$ to be bounded may be a material forming the semiconductor layer, the control gate electrode, a tunnel insulating film provided between the semiconductor layer and the organic molecular layer, or a block insulating film provided between the organic molecular layer and the control gate electrode The nonvolatile semiconductor memory device according to the present embodiment further includes a tunnel insulating film provided between the semiconductor layer and the organic monomolecular layer, and a block insulating film provided between the organic molecular layer and the control gate electrode.

The semiconductor memory device according to the present embodiment is provided with an organic molecular layer to serve as a charge storing layer between the tunnel insulating film and the block insulating film. A molecular structure of the organic molecule constituting the organic molecular layer contains an ion-pair compound made up of an ion-pair structure. The ion-pair structure has a positively charged metal complex molecule unit and a negatively charged counter ion.

Being provided with the above configuration, the semiconductor memory device according to the present embodiment realizes two stable states, a state where the metal complex molecule unit holds an electron, and a state where it does not hold an electron. Hence electrons are stably held in the charge storing layer. This leads to improvement in charge retention properties (data retention properties) of a memory cell.

Figure 2:
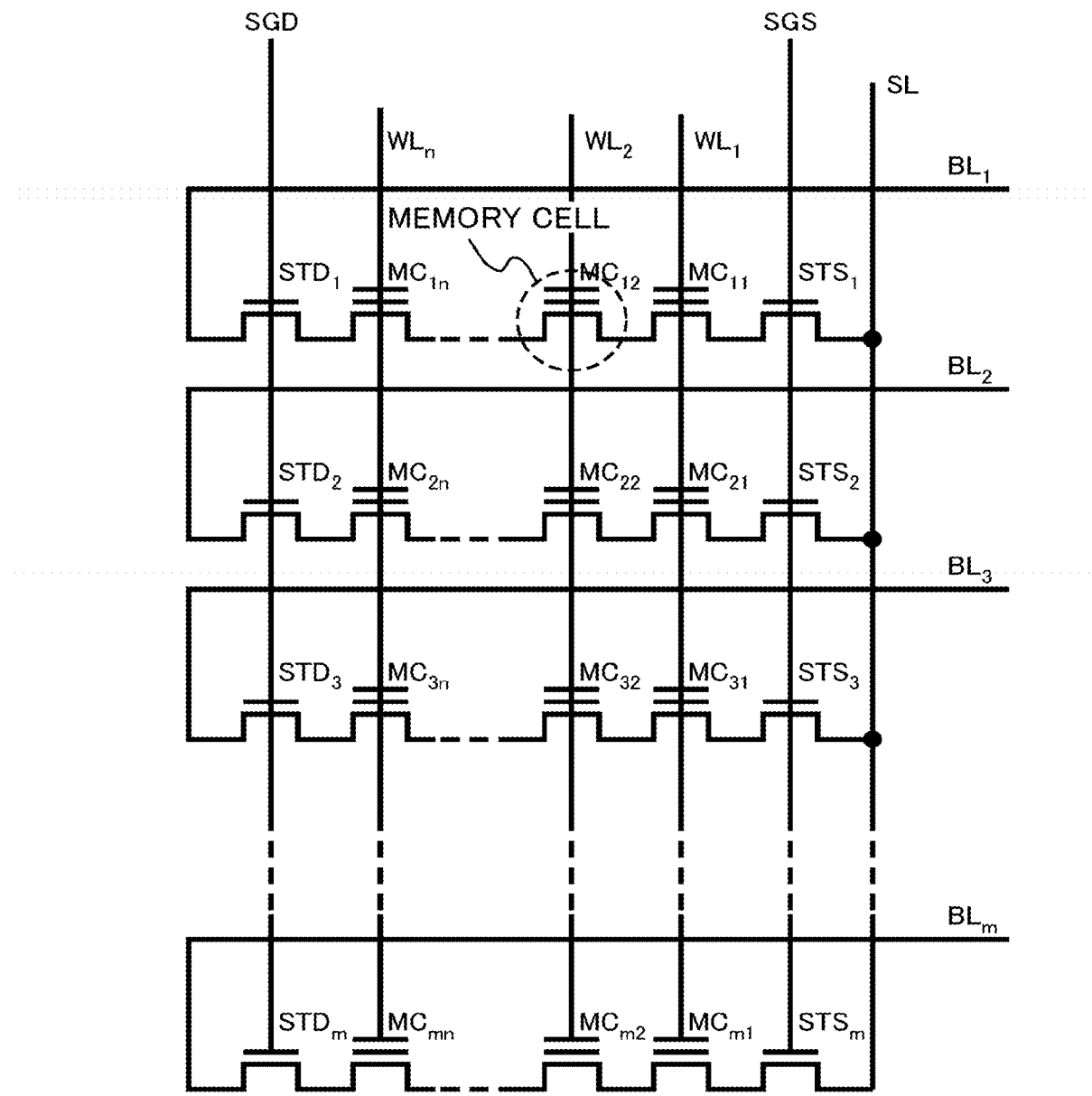
FIG. 2 is a circuit diagram of a memory cell array of the nonvolatile semiconductor memory device according to the first embodiment.

FIG. 1 is a sectional view of a memory cell unit of the nonvolatile semiconductor memory device according to the present embodiment. FIG. 2 is a circuit diagram of a memory cell array of the nonvolatile semiconductor memory device according to the present embodiment. The nonvolatile semiconductor memory device according to the present embodiment is an NAND nonvolatile semiconductor memory device.

As shown in FIG. 2, for example, the memory cell array is made up of memory cell transistors $MC_{11}$ to $MC_{1n}$, $MC_{21}$ to $MC_{2n}$, . . . , and $MC_{m1}$ to $MC_{mn}$, as m×n (m and n are integers) transistors having a floating-gate structure. In the memory cell array, these memory cell transistors are arrayed in a column direction and in a row direction, and a plurality of memory cell transistors are thereby arranged in a matrix form.

In the memory cell array, for example, the memory cell transistors $MC_{11}$ to $MC_{1n}$ and select gate transistors $STS_1$ and $STD_1$ are series-connected, to form an NAND string (memory string) as a cell unit.

A drain region of the select gate transistor $STS_1$ for selecting the memory cell transistors $MC_{11}$ to $MC_{1n}$ is connected to a source region of the memory cell transistor $MC_{11}$ located at the end of the array of the series-connected group of the memory cell transistors $MC_{11}$ to $MC_{1n}$. Further, a source region of the select gate transistor $STD_1$ for selecting the memory cell transistors $MC_{11}$ to $MC_{1n}$ is connected to a drain region of the memory cell transistor $MC_{1n}$ located at the end of the array of the series-connected group of the memory cell transistors $MC_{11}$ o $MC_{1n}$.

Select gate transistors $STS_2$ to $STS_m$, memory cell transistors $MC_{21}$ to $MC_{2n}$, . . . , and $MC_{m1}$ to $MC_{mn}$, and select gate transistors $STD_2$ to $STD_m$ are also series-connected respectively, to constitute NAND strings.

A common source line SL is connected to the sources of the select gate transistors $STS_1$ to $STS_m$. The memory cell transistors $MC_{11}$, $MC_{21}$, . . . , and $MC_{m1}$, the memory cell transistors $MC_{12}$, $MC_{22}$, . . . , and $MC_{m2}$, . . . and the memory cell transistors $MC_{1n}$, $MC_{2n}$, . . . , and $MC_{mn}$ are each connected by word lines $WL_1$ to $WL_n$ which control operating voltages to be applied to the control gate electrodes.

Further provided are a common select gate line SGS for the select gate transistors $STS_1$ to $STS_m$ and a common select gate line SGD for the select gate transistors $STD_1$ to $STD_m$.

It is to be noted that a peripheral circuit, not shown and configured to control the memory cell array of FIG. 2, is formed on the periphery of the memory cell array.

FIG. 1 shows a cross section of a memory cell in the memory cell array shown in FIG. 2, e.g., the memory cell surrounded by a dashed line in FIG. 2. In the present embodiment, a description will be given by taking as an example a case where a transistor of the memory cell is an n-type transistor having electrons as carriers.

The memory cell is formed, for example, on a p-type silicon semiconductor layer 10 containing p-type impurities. Then, a tunnel insulating film 12 is provided on the silicon semiconductor layer 10, an organic molecular layer (charge storing layer) 14 is provided on the tunnel insulating film 12, a block insulating film 16 is provided on the charge storing layer 14, and a control gate electrode 18 is provided on the block insulating film 16. A source region 20 and a drain region 22 are formed in the semiconductor layer 10 on each side of the control gate electrode 18. A region below the control gate electrode 18 in the semiconductor layer 10 is a channel region 24. The channel region 24 is interposed between the source region 20 and the drain region 22.

Herein, the charge storing layer 14 has a function to actively store charges as memory cell information. Then, at the time of performing writing/erasing on the memory cell, the tunnel insulating film 12 functions as an electron/hole transfer pathway between the channel region 24 in the semiconductor layer 10 and the charge storing layer 14 through a tunneling phenomenon. Further, at the time of reading/standby, the tunnel insulating film 12 has a function to suppress electron/hole transfer between the channel region 24 and the charge storing layer 14 due to its barrier height. The block insulating film 16 is a so-called interelectrode insulating film, and has a function to block electron/hole flow between the charge storing layer 14 and the control gate electrode 18.

Other than silicon, the semiconductor layer 10 can be applied with silicon germanide, germanium, a compound semiconductor, and the like.

The tunnel insulating film 12 is, for example, a silicon oxide ($SiO_2$) film. The material for the tunnel insulating film 12 is not restricted to exemplified silicon oxide, but another insulating film such as aluminum oxide can be applied as appropriate.

The thicker the tunnel insulating film 12 is, the higher the insulation properties become and the more hardly the stored charges escape. However, when it is excessively thick, a film thickness of the nonvolatile semiconductor memory device itself becomes thick, which is not desirable. Hence the thickness of the tunnel insulating film 12 is desirably not larger than 10 nm, and more desirably not larger than 5 nm. It is to be noted that the foregoing thicknesses are all physical film thicknesses.

Further, the tunnel insulating film 12 may be a stacked film. For example, materials can be stacked in order to promote chemical adsorption of the organic molecules constituting the organic molecular layer 14 to the surface of the tunnel insulating film. For example, a stacked film of a silicon oxide film and an aluminum oxide film is applicable.

The charge storing layer 14 is made up of a monomolecular film, for example. The charge storing layer 14 is desirably a monomolecular film from the viewpoints of scaling-down of the memory cell and stabilization of the properties. A thickness of the charge storing layer 14 is desirably not larger than 20 nm from the viewpoint of scaling-down the memory cell.

The block insulating film 16 is a metal oxide such as hafnium oxide ($HfO_2$). Other than hafnium oxide described above, a metal oxide such as aluminum oxide ($Al_2O_3$), silicon oxide, zirconium oxide or titanium oxide is used for the block insulating film 16.

The thicker the block insulating film 16 is, the higher the insulation properties become and the more hardly the stored charges escape. However, when it is excessively thick, a film thickness of the nonvolatile semiconductor memory device itself becomes thick, which is not desirable. Hence the thickness of the block insulating film 16 is desirably not larger than 20 nm, and more desirably not larger than 10 nm.

The block insulating film 16 may be either a single-layer film or a stacked film. The block insulating film 16 is, for example, a metal oxide film formed by atomic layer deposition (ALD).

Further, the control gate electrode 18 is, for example, polycrystalline silicon introduced with impurities and imparted with conductivity. An arbitrary conductive material can be used for the control gate electrode 18. Other than polycrystalline silicon described above, for example, the amorphous silicon introduced with impurities and imparted with conductivity, or the like, is usable for the control gate electrode 18. Further, metal, an alloy, a metal semiconductor compound or the like may be used for the control gate electrode 18.

Then, the source region 20 and the drain region 22 are formed, for example, of n-type diffusion layers containing n-type impurities.

Figure 3:
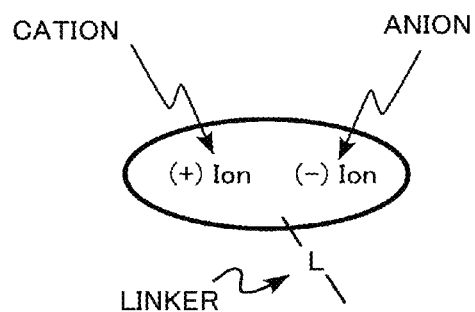
FIG. 3 is an explanatory diagram of an organic molecule of the first embodiment.

FIG. 3 is an explanatory diagram of an organic molecule of the present embodiment. The organic molecule of the present embodiment contains an ion-pair compound having an ion-pair structure of a cation ((+) Ion) in FIG. 3) and an anion ((−) Ion) in FIG. 3). The organic molecule of the present embodiment is provided with a metal complex molecule unit as a cation. Further, it is provided with a counter ion, which cancels a charge of the metal complex molecule unit and holds an electrically neutral state, as an anion.

Further, the organic molecule of the present embodiment includes a chemical modified group called a linker (L in FIG. 3). The organic molecule may be chemically bonded to the semiconductor layer 10 or the control gate electrode 18 via a linker.

Examples of the linker include an ether group, a silyl ether group, a dimethylsilyl ether group, a diethylsilyl ether group, a carboxy ester group, a sulfonyl ester group, a phosphonic acid ester group, an amide group, a thioether group, and the like. Since a linker has a different degree of easiness in bonding formation depending on a material to be bonded, a chemical structure of the optimal linker varies depending on the material to be bonded. For a semiconductor material or an insulating film of a metal oxide or the like, for example, an ether group, a silyl ether group, a dimethylsilyl ether group, a diethylsilyl ether group, a carboxy ester group, a sulfonyl ester group, a phosphonic acid ester group, an amide group or the like is desirable. From the viewpoints of easiness in organic synthesis and chemical reactivity with a metal oxide, silyl ether group, a dimethylsilyl ether group, a diethylsilyl ether group and a phosphonic acid ester group are desirable. Especially in the case of the metal oxide being aluminum oxide, an amide group or the like, a phosphonic acid ester is more desirable. Further, the linker may contain in its structure an alkyl group, a phenyl group or the like to serve as a spacer.

The organic molecular layer 14 of the present embodiment includes a molecular structure described by the following molecular formula (1).

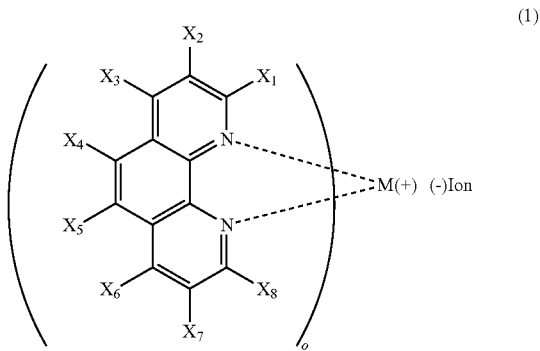

(1)

M(+) in the molecular formula (1) is a positively charged metal ion selected from a group of a copper ion, an iron ion, a ruthenium ion, a cobalt ion, an iridium ion, a manganese ion, a vanadium ion, a titanium ion, a zirconium ion, a silver ion and a platinum ion. "o" in the molecular formula (1) is an integer which is not smaller than 1 and changes in accordance with a kind of the metal ion. At least one of $X_1$ to $X_8$ is a chemical modified group for chemically bonding the organic molecule to a material at the semiconductor layer side or the control gate electrode side. (−) Ion is a negatively charged ion selected from a group consisting of a chlorine ion, a bromide ion, a triflate ion, a perchlorate ion, a hexafluorophosphate ion and tetrafluoroboron ion.

M(+) in the molecular formula (1) is a positively charged metal ion selected from a group consisting of a copper ion, an iron ion, a ruthenium ion, a cobalt ion, an iridium ion, a manganese ion, a vanadium ion, a titanium ion, a zirconium ion, a silver ion and a platinum ion. That is, the metal complex molecule unit is a copper complex, an iron complex, a ruthenium complex, a cobalt complex, an iridium complex, a manganese complex, a vanadium complex, a titanium complex, a zirconium complex, a silver complex or a platinum complex. In the molecular formula (1) o is an integer which is not smaller than 1 and changes in accordance with a kind of the metal ion.

Further, a ligand of the metal complex molecule unit is provided with a molecular structure named phenanthroline as shown in the molecular formula (1). Phenanthroline has excellent thermal resistance.

As shown in the molecular formula (1), the counter ion is a chlorine ion, a bromide ion, a triflate ion, a perchlorate ion, a hexafluorophosphate ion or tetrafluoroboron ion.

Further, in the molecular formula (1), at least any one of $X_1$ to $X_0$ is a linker. There may be two or more linkers. $X_1$ to $X_8$ other than the linker may be hydrogen for example.

For example, $X_1$ to $X_8$ in the molecular formula (1) are a chemical modified group or a chemical structure. The chemical modified group contain a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group. The chemical structure selected from a group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a phosphonic acid, a sulfonic acid, an amino acid, a carboxyl group, a thiol group, an alkyl group consisting of hydrocarbon, a halogen group, and hydrogen. $X_1$ to $X_8$ may be the same or different. However, at least one of $X_1$ to $X_8$ is a chemical modified group containing a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ether group and a thioether group.

Moreover, in the molecular formula (1), $X_1$ and $X_8$ are desirably bulky so as to cause occurrence of a steric obstacle. When the steric obstacle occurs, a stereoscopic position of the ligand hardly changes. This prevents the metal complex molecule unit shown in the molecular formula (1) from releasing a charge received by writing. Prevention of a charge from being released means that the memory time of the nonvolatile semiconductor memory device becomes longer, and that data retention properties become better. Therefore, $X_1$ and $X_8$ are desirably bulky substituent groups, and are desirably long-chain alkyl groups, for example. It is to be noted that the end of the long-chain alkyl group maybe bonded with the linker.

In the molecule of the molecular formula (1), a metal ion of the metal complex molecule unit receives an electron, or releases it, to cause a large change in molecular structure. The metal ion receiving an electron or releasing it causes occurrence of large rearrangement of dipoles. This leads to existence of two stable states, a state where the metal complex molecule unit holds an electron, and a state where it does not hold an electron. Further, by the metal ion receiving an electron or releasing it, a counter ion is also rearranged in a direction for stabilizing the two states. This farther stabilizes the two states. It is thus possible to realize the nonvolatile semiconductor memory device excellent in charge retention properties.

The organic molecule of the present embodiment desirably has a molecular structure described by a molecular formula (2).

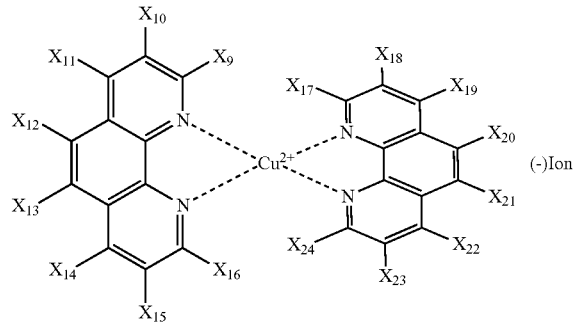

(2)

At least one of $X_9$ to $X_{24}$ in the molecular formula (2) is a chemical modified group for chemically bonding the organic molecule to the semiconductor layer side or the control gate electrode side. (−) Ion is a negatively charged ion selected from a group consisting of a chlorine ion, a bromide ion, a triflate ion, a perchlorate ion, a hexafluorophosphate ion and tetrafluoroboron ion.

In the molecular formula (2), the metal complex molecule unit is a copper complex containing a copper ion as a metal ion. The copper ion exists stably in a state where a divalent is positively charged state. Further, the copper ion tends to receive an electron, and by receiving an electron, it is stabilized in a state where a monovalent is positively charged. The copper ion is slow in electron exchange as compared to other metal ions, thereby leading to improvement in charge retention properties of the nonvolatile semiconductor memory device.

It is to be noted that in the case of the metal ion being a divalent copper ion, it is stabilized in a state where two phenanthroline ligands are bonded, namely a state where o=2 in the molecular formula (1).

Further, in the molecular formula (2), at least anyone of $X_9$ to $X_{24}$ is a linker. There may be two or more linkers.

For example, a chemical structure is formed in which $X_9$ to $X_{24}$ in the molecular formula (2) are a chemical modified group or a chemical structure, the chemical modified group containing a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group, and the chemical structure selected from a group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a phosphonic acid, a sulfonic acid, an amino acid, a carboxyl group, a thiol group, an alkyl group consisting of hydrocarbon, a halogen group, and hydrogen. $X_9$ to $X_{24}$ may be the same or different. However, at least one of $X_9$ to $X_{24}$ is a chemical modified group containing a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group.

In the molecular formula (2), $X_9$, $X_{16}$, $X_{17}$ and $X_{24}$ are desirably bulky substituent groups. By being bulky substituent groups, $X_9$ and $X_{16}$ are stereoscopically collided with $X_{17}$ and $X_{24}$, and a stereoscopic position of a phenanthroline ligand hardly changes. This prevents releasing of a charge received by writing. As a bulky substituent group, for example, a long-chain alkyl group is considered, and a linker may be bonded to the end of the long-chain alkyl group.

$X_{10}$ to $X_{15}$ and $X_{18}$ to $X_{23}$ are desirably hydrogen from the viewpoint of simplifying organic synthesis. Further, two out of $X_9$, $X_{16}$, $X_{17}$ and $X_{24}$ are desirably bulky and methyl groups from the viewpoint of simplifying organic synthesis, and the remaining two are desirably bulky and linkers bonded with the substrate from the viewpoint of simplifying organic synthesis.

Accordingly, the organic molecule of the present embodiment desirably has a molecular structure described by a molecular formula (3).

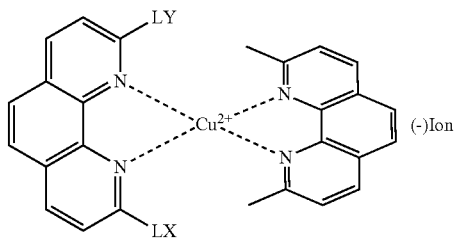

(3)

At least one of LX and LY in the molecular formula (3) is a chemical modified group for chemically bonding the organic molecule to the semiconductor layer side or the control gate electrode side. (−) Ion is a negatively charged ion selected from a group consisting of a chlorine ion, a bromide ion, a triflate ion, a perchlorate ion, a hexafluorophosphate ion and tetrafluoroboron ion.

A chemical structure is formed in which LX and LY in the molecular formula (3) are selected from a chemical modified group containing a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group, or a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a phosphonic acid, a sulfonic acid, an amino acid, a carboxyl group, a thiol group, an alkyl group consisting of hydrocarbon, a halogen group, and hydrogen. LX and LY may be the same or different. However, either LX or LY is a chemical modified group containing a group selected from a group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group.

LX and LY in the molecular formula (3) are desirably phosphonic acid ester due to simplicity in organic synthesis. Further, an alkyl group to serve as a spacer is desirably contained. The containment of the alkyl group prevents an electron received by writing into the nonvolatile semiconductor memory device from returning to its original position.

Accordingly, the organic molecule of the present embodiment desirably has a molecular structure described by a molecular formula (4).

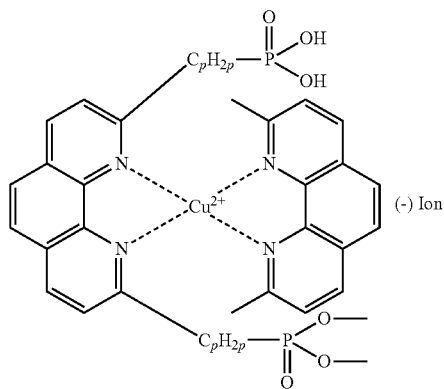

(4)

"p" in the molecular formula (4) is an integer not smaller than 0. (−) Ion is a negatively charged ion selected from a group consisting of a chlorine ion, a bromide ion, a triflate ion, a perchlorate ion, a hexafluorophosphate ion and tetrafluoroboron ion.

An ion radius of (−) Ion is desirably moderately large from the viewpoint of facilitating occurrence of a change in displacement of (−) Ion accompanied by the metal ion receiving or releasing an electron, and from the viewpoint of increasing an amount of change in displacement. From these viewpoints, (−) Ion is desirably a triflate ion, a perchlorate ion, a hexafluorophosphate ion or tetrafluoroboron ion. Further, from the viewpoint of easiness of organic synthesis, (−) Ion is desirably a triflate ion.

"p" in the molecular formula (4) is an integer not smaller than 0 which sets a length of a spacer. The phenanthroline ligand is desirably distant from the substrate or the like bonded through the linker. Hence the spacer is desirably long. However, when the spacer is excessively long, organic synthesis becomes difficult and thermal resistance deteriorates. Therefore, p=6 is desirable.

Accordingly, the organic molecule of the present embodiment desirably has a molecular structure described by a molecular formula (5).

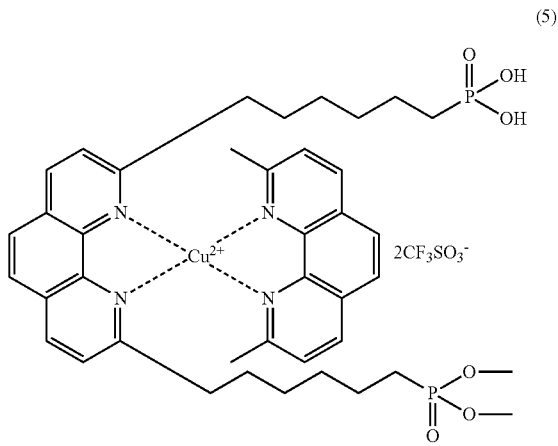

(5)

It is to be noted that, from the viewpoint of facilitating organic synthesis, p in the molecular formula (4) is desirably p=2. Accordingly, the organic molecule of the present embodiment desirably has a molecular structure described by a molecular formula (6).

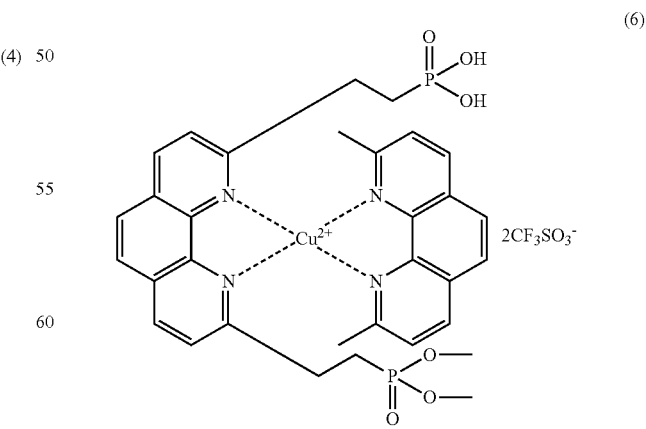

(6)

Further, the molecular formulas (4), (5) and (6) have structures where the organic molecule takes one of the phosphonic acid ester groups as a linker. They may have structures where both of the two phosphonic acid ester groups of the organic molecule are taken as linkers. From this viewpoint, the organic molecule of the present embodiment desirably has a molecular structures described by a molecular formulas (7), (8) and (9).

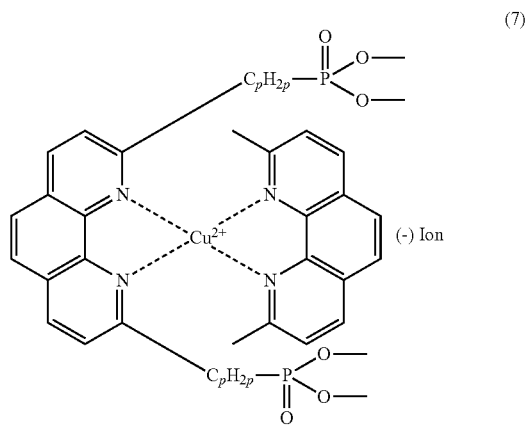

(7)

p in the molecular formula (7) is an integer not smaller than 0. (-) Ion is a negatively charged ion selected from a group consisting of a chlorine ion, a bromide ion, a triflate ion, a perchlorate ion, a hexafluorophosphate ion and tetrafluoroboron ion.

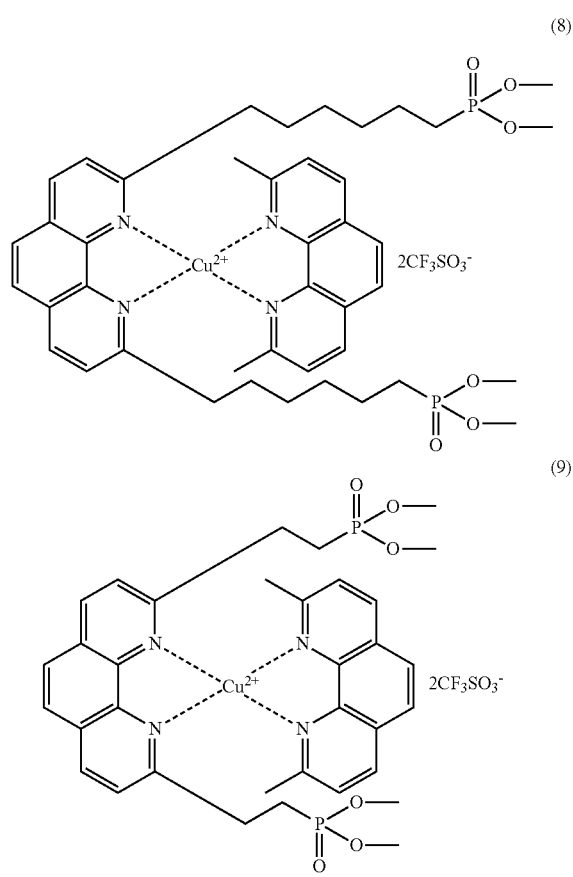

(8)

(9)

Figure 4:
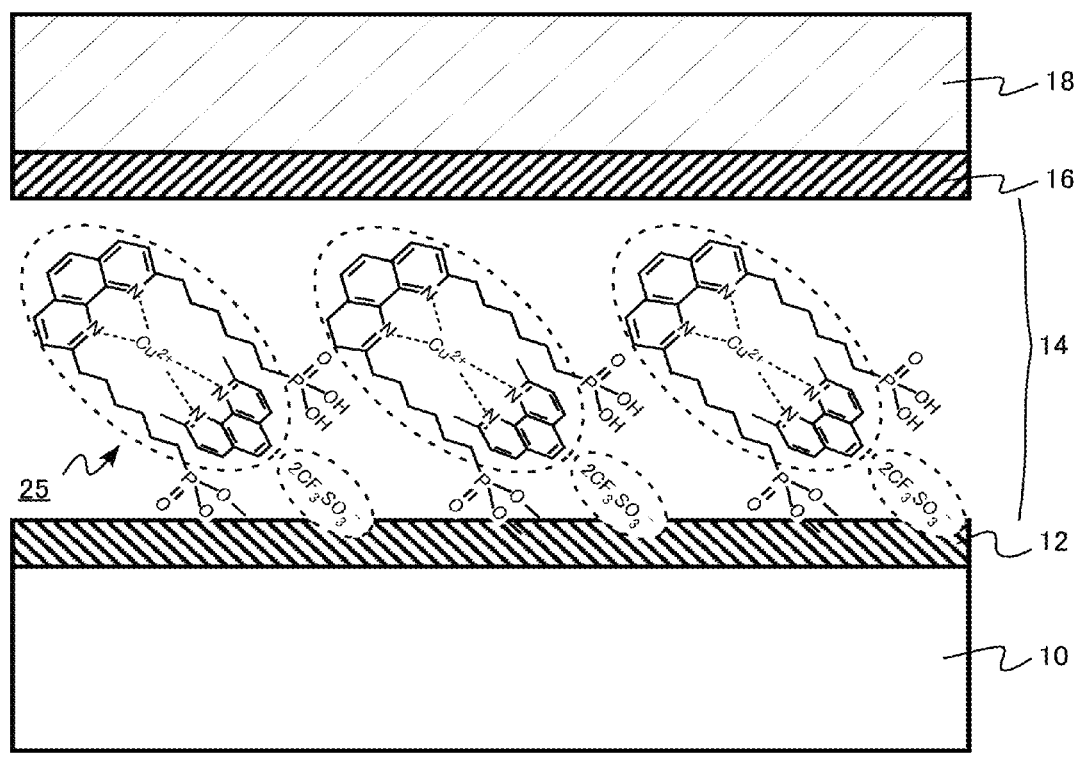
FIG. 4 is an enlarged schematic view of a memory cell unit of the nonvolatile semiconductor memory device according to the first embodiment.

FIG. 4 is an enlarged schematic view of one example of a memory cell unit of the nonvolatile semiconductor memory device according to the present embodiment. This is a view showing a detail of a structure and adsorption pattern of each of organic molecules used for the charge storing layer 14.

The charge storing layer 14 is made up of organic molecules (charge storing molecules) 25. The charge storing molecule 25 has a function to store charges that serve as data of the memory cell. The charge storing molecule 25 of the memory cell shown in FIG. 4 has a molecular structure described by the above molecular formula (5).

The tunnel insulating film 12 is, for example, a stacked film of a silicon oxide film and an aluminum oxide film. One end of a phosphonic acid ester group as a linker of the charge storing molecule 25 is chemically bonded with the surface of the aluminum oxide film of the tunnel insulating film 12, to constitute the charge storing layer 14. The charge storing layer 14 is a monomolecular film.

The charge storing molecule 25 can be detected by the following analysis method. That is, it can be detected using a mass spectroscope (MS), a secondary ionic mass spectrometer (SIMS), a nuclear magnetic resonator (NMR), an element analyzer, an infrared reflection absorption spectroscopy (IR-RAS), an X-ray fluorescence instrument (XRF), an X-ray photoelectron instrument (XPS), an ultraviolet-visible spectrophotometer (UV-vis), a spectrophotofluorometer (FL), or the like.

When an insulating film of a metal oxide or the like is formed on the charge storing layer 14, for example, the analysis is performed while shaving the surface, for example, with a sputter using argon ions, or the like. Alternatively, the charge storing layer 14 is dissolved and peeled by a hydrofluoric acid aqueous solution or the like simultaneously with the insulating film of the metal oxide or the like, and the solution is analyzed.

Further, in the method for performing the analysis by shaving the surface by means of the above sputter or the like, heating processing may be performed as the shaving method. In this case, a gas containing the shaved material may be adsorbed to another material such as an activated carbon, and another material such as the activated carbon adsorbed with the gas may be analyzed and detected. Further, in the method for peeling the material by the hydrofluoric acid aqueous solution or the like and analyzing the solution, the dissolved and peeled material may be subjected to a reduced pressure or a thermal treatment to be concentrated, and may then be analyzed and detected.

At the time of a writing operation of the memory cell according to the present embodiment, a voltage is applied between the control gate electrode 18 and the semiconductor layer 10 such that the control gate electrode 18 becomes a relatively positive voltage, to store negative charges into the charge storing layer 14. When the control gate electrode 18 becomes a relatively positive voltage, an inversion layer is formed in the channel region 24 and electrons are stored thereinto. The electrons move in the tunnel insulating film 12, and are stored in the charge storing molecules of the charge storing layer 14.

In this state, a threshold voltage of the transistor of the memory cell becomes high as compared to the state of the electrons not being stored. Namely, this is a state where the transistor does not tend to be turned on. This is a state where data "0" has been written.

At the time of performing a data erasing operation, a voltage is applied between the control gate electrode 18 and the semiconductor layer 10 such that the control gate electrode 18 becomes a relatively negative voltage. Due to an electric field between the control gate electrode 18 and the semiconductor layer 10, the electrons stored in the charge storing layer 14 transfer in the tunnel insulating film 12 and are drawn to the semiconductor layer 10.

In this state, a threshold voltage of the transistor of the memory cell becomes low as compared to the state of the data "0". Namely, this is a state where the transistor tends to be turned on. This state is data "1".

At the time of reading data, a voltage is applied between the source region 20 and the drain region 22. For example, in the state of data "0" where electrons are stored, with the threshold voltage of the transistor being high, an inversion layer is not formed in the channel region 24 and a current does not flow between the source and the drain.

On the other hand, in the erased state, namely in the state of the data "1" where charges are not stored, with the threshold voltage of the transistor being low, an inversion layer is formed in the channel region 24 and a current flows between the source and the drain. As thus described, detecting a current amount of the transistor allows reading whether the data is the data "0" or the data "1".

It should be noted that at the time of performing a data verifying operation to check whether or not writing has been sufficiently performed after performing the data writing operation, a similar operation to one at the time of the reading operation is performed. A voltage is applied between the source region 20 and the drain region 22, and when a desired current does not flow, the data writing operation is performed again.

Next, a method for manufacturing the nonvolatile semiconductor memory device according to the present embodiment will be described.

The method for manufacturing the nonvolatile semiconductor memory device according to the present embodiment includes: forming the tunnel insulating film 12 on the semiconductor layer 10; forming the charge storing layer 14 on the tunnel insulating film 12; forming the block insulating film 16 on the charge storing layer 14; and forming the control gate electrode 18 on the block insulating film 16.

For example, the tunnel insulating film 12 is formed on the semiconductor layer 10 of single crystal silicon. When the tunnel insulating film 12 is silicon oxide, it can be formed, for example, by introducing a silicon substrate into a thermal oxidization furnace for forcible oxidation.

Further, the tunnel insulating film 12 can also be formed by a means of a film forming device for ALD, CVD, sputtering or the like. In the case of film formation, it is desirable to anneal the insulating film after the film formation, by means of a Rapid Thermal Annealing (RTA) device.

Subsequently, the charge storing layer 14 is formed on the tunnel insulating film 12.

In the case of forming the charge storing layer 14, for example, the following methods are applicable.

First, the surface of the tunnel insulating film 12 to be a base layer where the charge storing layer 14 is formed is cleaned. For this cleaning, it is possible to employ, for example, cleaning by means of a mixed solution of sulfuric acid and hydrogen peroxide solution (a mixed ratio is 2:1, for example), or a UV cleaning performed by irradiating the insulating film surface with ultraviolet light.

Next, the charge storing molecule 25 having the molecular structure of the molecular formula (1) is prepared. The cleaned surface of the tunnel insulating film 12 is soaked into a solution obtained by dissolving the charge storing molecule 25 into a solvent. The charge storing molecule 25 is in the state before bonding to the base layer. Then, the linker of the charge storing molecule 25 is reacted with the surface of the tunnel insulating film 12.

The charge storing molecule 25 in the state before bonding to the base layer is a hydrogenated body, a halogenated body, a methoxy body, an ethoxy body or the like before the linker of the charge storing molecule 25 is bonded to the base layer. Examples of the charge storing molecule 25 include a hydroxy group, a trimethoxysilyl group, a dimethylmethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a carboxy group, a sulfonyl group, a phosphonate group, a methylphosphonate ester group, an ethylphosphonate ester group, an amino group and a thiol group.

As the solvent, it is considered that one with high solubility of the charge storing molecule 25 is used, and organic solvents such as water, acetone, toluene, ethanol, methanol, hexane, cyclohexanone, benzene, chlorobenzene, xylene, tetrahydrofuran, dimethylsulfoxide, N,N-dimethylformamide, anisole, cyclohexanone, and methoxypropionic acid methyl are applicable. In some cases, the charge storing molecule 25 dissolved into water exists, and in those cases, water can be used as a solvent. Further, a mixture of these solvents can also be used as a solvent.

When the concentration of the charge storing molecule 25 to be dissolved into the solvent is excessively low, the reaction time becomes longer, and when it is excessively high, unnecessary adsorption molecules needing to be removed by a rinsing operation increase. Hence the concentration is desirably set to be an appropriate one. The concentration is desirably set to about 0.1 mM to 100 mM, for example.

Further, at this time, a catalyst may be added for the purpose of increasing the reactivity between the cleaned surface of the tunnel insulating film and the organic material. As the catalyst, acetic acid, formic acid, propionic acid, trifluoroacetic acid, triethylamine and ammonia which can be dissolved in the solvent are used. The amount of the catalyst added is desirably small, since the organic material is self-reacted in the solvent causing a side reaction such as polymerization when it is excessively large. It is desirably not larger than 3% with respect to a volume of the solution.

The time for soaking the surface of the insulating film into the solution of the charge storing molecule 25 is desirably the extent of the time for occurrence of a sufficient reaction, and specifically, not shorter than one minute is desirably taken.

The surface is then soaked into the used solvent, and rinsed using an ultrasonic cleaner. In order to rinse the unnecessarily physically adsorbed organic material, this operation is desirably performed at least twice or more, as the solvent is replaced by a new one.

Subsequently, the surface is soaked into ethanol, and rinsed by use of the ultrasonic cleaner.

The solvent is then removed by a nitride air gun, a spin coater or the like, and drying is then performed. Thereby, the charge storing layer 14 made up of the charge storing molecules 25 is formed on the tunnel insulating film 12. The charge storing layer 14 becomes a monomolecular film due to self-assembling of the charge storing molecule 25.

Thereafter, for example, a hafnium oxide film is deposited on the charge storing layer 14, to form the block insulating film 16.

The block insulating film 16 can be formed by means of a film forming device for atomic layer deposition (ALD), chemical vapor deposition (CVD), sputtering or the like. There is desirably used a film forming device with which the charge storing layer 14 formed of the organic molecules is not disassembled and a damage is small, and for example, a thermal ALD device is desirable. When the insulating film after the film formation is annealed using the RTA device, an atomic density in the film increases, which is desirable.

An impurity-doped polycrystalline silicon film is then formed by chemical vapor deposition (CVD), for example, to form the control gate electrode 18. The stacked films are then patterned, thereby to form a gate electrode structure.

Subsequently, for example, n-type impurities are ion-planted using the control gate electrode 18 as a mask, to form the source region 20 and the drain region 22. In such a manner, it is possible to manufacture the nonvolatile semiconductor memory device shown in FIG. 1.

As above, according to the present embodiment, the charge storing molecule 25 having the molecular structure of the molecular formula (1) is used for the charge storing layer 14, thereby to allow realization of a semiconductor memory device that accomplishes excellent charge retention properties.

Second Embodiment

A nonvolatile semiconductor memory device according to this embodiment differs from the first embodiment in that the tunnel insulating film is not provided and the charge storing layer has the function of the tunnel insulating film. Hereinafter, descriptions of contents that overlap with those of the first embodiment will be omitted.

Figure 5:
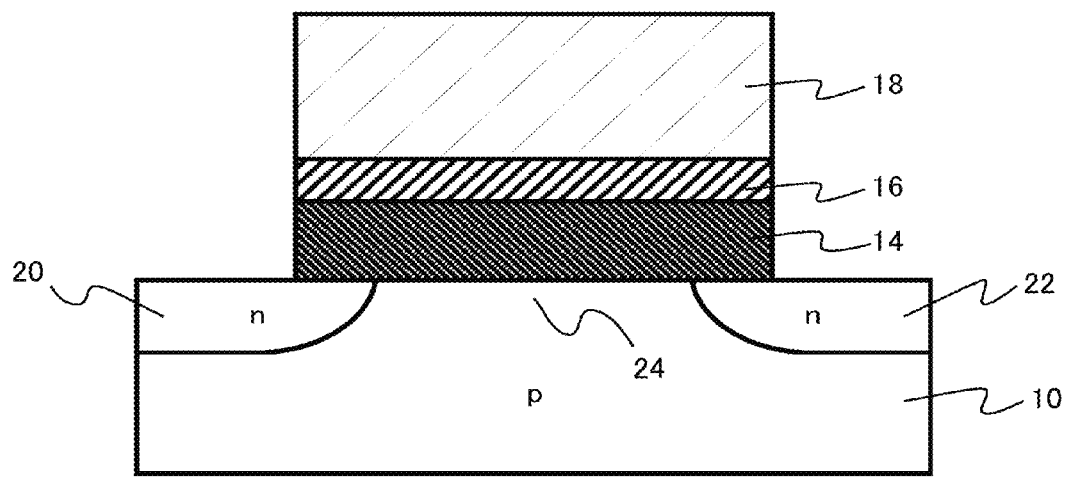
FIG. 5 is a sectional view of a memory cell unit of a nonvolatile semiconductor memory device according to a second embodiment.

FIG. 5 is a sectional view of a memory cell unit of the nonvolatile semiconductor memory device according to the present embodiment.

The memory cell is formed, for example, on an n-type silicon semiconductor layer 10 containing n-type impurities. Then, the charge storing layer 14 is provided on the silicon semiconductor layer 10, the block insulating film 16 is provided on the charge storing layer 14, and the control gate electrode 18 is provided on the block insulating film 16. The source region 20 and the drain region 22 are formed in the semiconductor layer 10 on each side of the control gate electrode 18. A region below the control gate electrode 18 in the semiconductor layer 10 is a channel region 24. The channel region 24 is interposed between the source region 20 and the drain region 22.

In the present embodiment, the charge storing molecule 25 in the charge storing layer 14 also has the function of the tunnel insulating film. In the present embodiment, the charge storing molecule 25 is directly chemically bonded to the semiconductor layer 10.

Similarly to the first embodiment, the charge storing molecule 25 has a function to store charges that serve as data of the memory cell.

Then, the linker of the charge storing molecule 25 includes an alkyl chain, and a function to hold insulation properties with the semiconductor layer 10 is expressed. For example in the above molecular formula (4) or (7), the charge storing molecule 25 has an alkyl chain with a carbon number (p) of an alkyl chain portion of not smaller than 6 and not larger than 30.

The carbon number of the alkyl chain is preferably not smaller than 6 and not larger than 30, and is more desirably not smaller than 6 and not larger than 20. This is because, when the carbon number is below the above range, the insulating resistance might deteriorate and the self-assembled monomolecular film might become difficult to form. Further, when the carbon number exceeds the above range, the film thickness might be large, rendering the down-scaling difficult.

The method for manufacturing the nonvolatile semiconductor memory device according to the present embodiment includes: forming the charge storing layer 14 that contains the charge storing molecules 25 having the molecular structure of the molecular formula (4) or (7) on the semiconductor layer 10 by self-assembling; forming the block insulating film 16 on the charge storing layer 14; and forming the control gate electrode 18 on the block insulating film 16.

For example, the charge storing layer 14 is formed on the semiconductor layer (semiconductor substrate) 10 of single crystal silicon by self-assembling.

This is similar to the first embodiment except that the charge storing layer 14 is directly formed on the semiconductor layer 10.

According to the present embodiment, similarly to the first embodiment, it is possible to realize a nonvolatile semiconductor memory device that accomplishes excellent charge retention properties. Further, in place of the tunnel insulating film of an inorganic material such as an oxide, the charge storing layer 14 realizes the function of the tunnel insulating film. Therefore, the physical film thickness of the memory cell structure can be small. This leads to realization of a nonvolatile semiconductor memory device provided with a finer memory cell. Further, eliminating the need for formation of the tunnel insulating film of the inorganic material can realize simplification of the manufacturing process.

In addition, for example, it is possible to give the function of the block insulating film to the organic molecular layer 14 by further providing an alkyl chain or the like on the control gate electrode 18 side of the charge storing molecule 25 of the organic molecular layer 14, so as to form a configuration where the block insulating film 16 of an inorganic material such as an oxide is omitted.

Third Embodiment

A nonvolatile semiconductor memory device according to the present embodiment is similar to the first embodiment except that a conductive layer is formed between the tunnel insulating film and the charge storing layer. Hereinafter, descriptions of contents that overlap with those of the first embodiment will be omitted.

Figure 6:
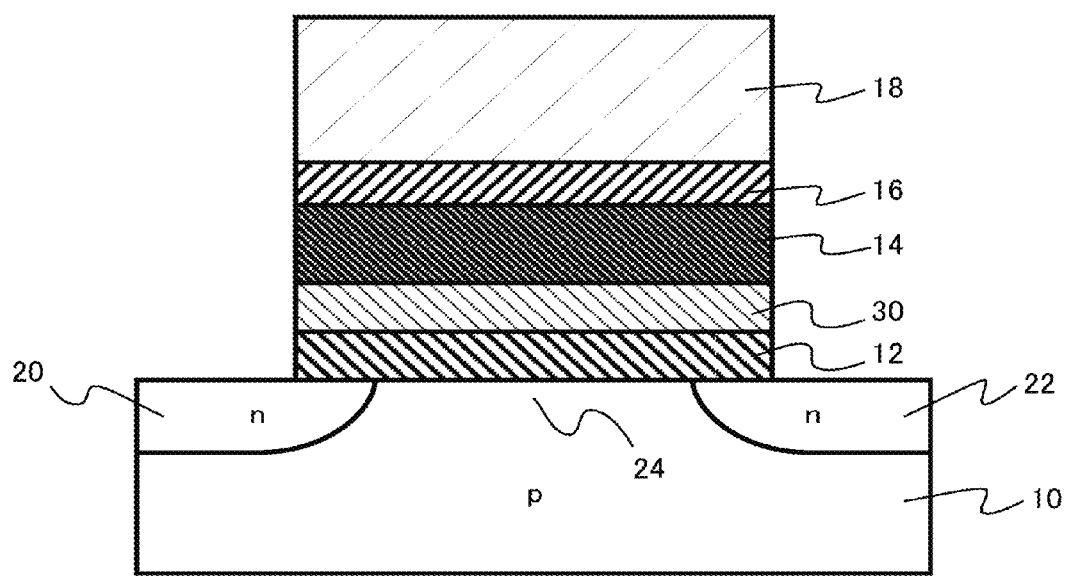
FIG. 6 is a sectional view of a memory cell unit of a nonvolatile semiconductor memory device according to a third embodiment.

FIG. 6 is a sectional view of a memory cell unit of the nonvolatile semiconductor memory device according to the present embodiment.

The memory cell is formed, for example, on a p-type silicon semiconductor layer 10 containing p-type impurities. Then, the tunnel insulating film 12 is provided on the silicon semiconductor layer 10, a conductive layer 30 is provided on the tunnel insulating film 12, the charge storing layer 14 is provided on the conductive layer 30, the block insulating film 16 is provided on the charge storing layer 14, and the control gate electrode 18 is provided on the block insulating film 16. The source region 20 and the drain region 22 are formed in the semiconductor layer 10 on each side of the control gate electrode 18. A region below the control gate electrode 18 in the semiconductor layer 10 is a channel region 24. The channel region 24 is interposed between the source region 20 and the drain region 22.

The conductive layer 30 has a function to uniformly disperse charges stored in the charge storing layer 14. Accordingly, a concentration distribution of constant charges without variations is given inside the charge storing layer 14, to realize a stable operation. Further, the conductive layer 30 has a function to read charges stored in the charge storing layer 14 so as to improve writing efficiency.

The conductive layer 30 is, for example, a semiconductor film, a metal film, or a metal compound film. For example, it is possible to use amorphous silicon or polycrystalline silicon introduced with impurities to impart conductivity.

In the case of the present embodiment, the charge storing molecule 25 is bonded onto the conductive layer 30 by self-assembling. At this time, when the conductive layer 30 is silicon, a chemical modified group to serve as a linker of the charge storing molecule 25 is desirably a silyl ether group from the viewpoint of facilitating bonding.

The method for manufacturing the nonvolatile semiconductor memory device according to the present embodiment includes: forming the tunnel insulating film 12 on the semiconductor layer 10; forming the conductive layer 30 on the tunnel insulating film 12; forming the charge storing layer 14 that contains the charge storing molecules 25 having the molecular structure of the molecular formula (1) on the conductive layer 30; forming the block insulating film 16 on the charge storing layer 14 by ALD, and forming the control gate electrode 18 on the block insulating film 16.

The conductive layer 30 is formed on the tunnel insulating film 12 for example by CVD, ALD, sputtering or the like. The charge storing layer 14 is then formed on the conductive layer 30.

This is similar to the first embodiment except that the tunnel insulating film 12 is formed on the semiconductor layer 10 and the charge storing layer 14 is formed on the conductive layer 30.

According to the present embodiment, similarly to the first embodiment, it is possible to realize a nonvolatile semiconductor memory device that accomplishes excellent charge retention properties. This leads to realization of a nonvolatile semiconductor memory device that operates stably and has excellent reading and writing characteristics.

Fourth Embodiment

A nonvolatile semiconductor memory device according to the present embodiment includes: a stacked structure having insulating layers and control gate electrode layers, the insulating layers and the control gate electrode layers being alternately stacked; a semiconductor layer provided as opposed to one of the control gate electrodes; and an organic molecular layer being provided between the semiconductor layer and the one of the control gate electrodes, the organic molecular layer having an organic molecule including a molecular structure described by a molecular formula (1):

The nonvolatile semiconductor memory device according to the present embodiment differs from the first embodiment in that it is a device with a three-dimensional structure, but descriptions of contents that overlap with those in the first embodiment will be omitted.

Figure 7:
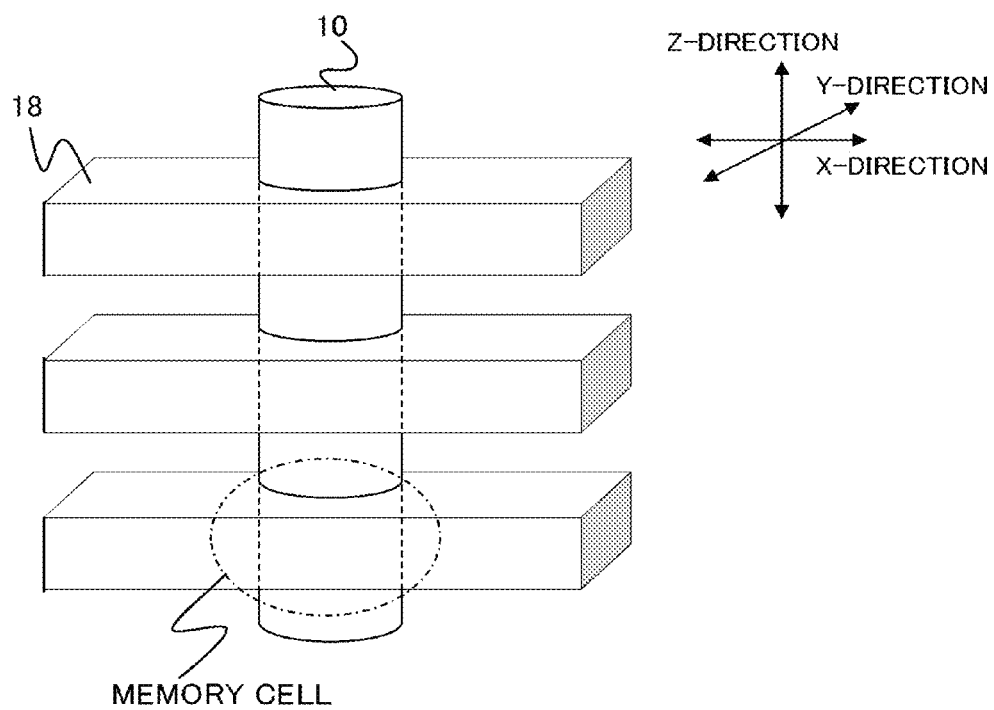
FIG. 7 is a three-dimensional conceptual view of a nonvolatile semiconductor memory device according to a fourth embodiment.
Figure 8:
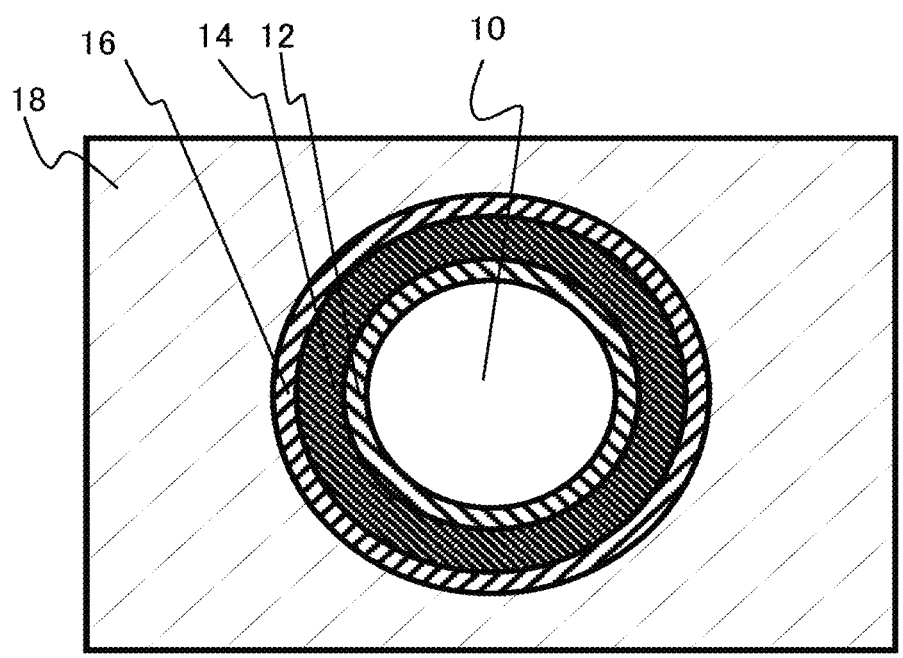
FIG. 8 is an X-Y sectional view of FIG. 7.
Figure 8:
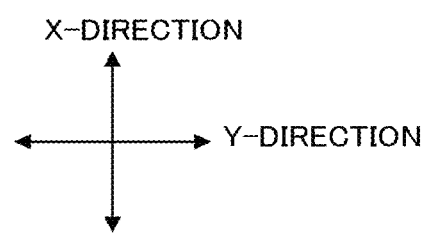
Figure 9:
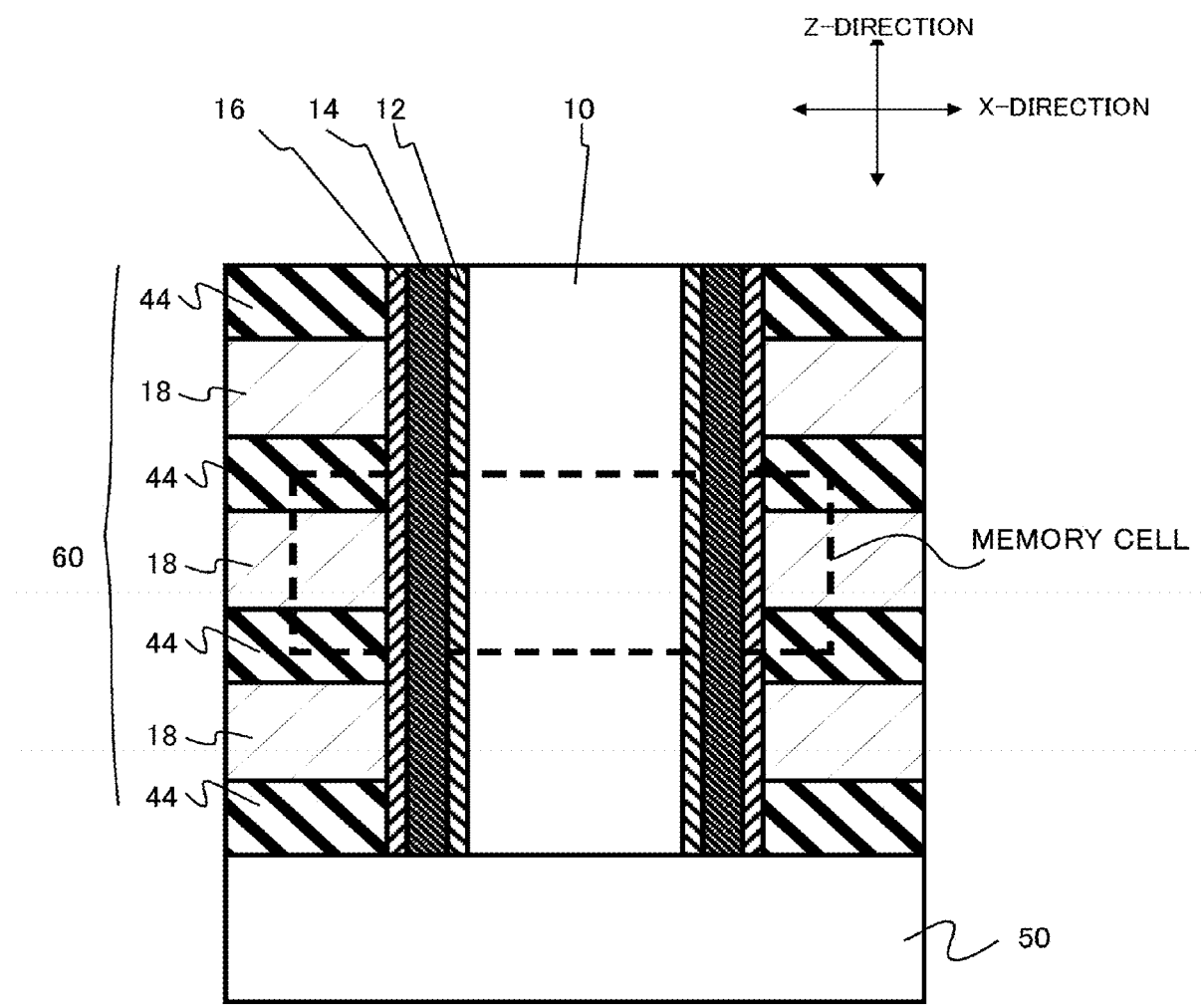
FIG. 9 is an X-Z sectional view of FIG. 7.

FIG. 7 is a three-dimensional conceptual view of the nonvolatile semiconductor memory device according to the present embodiment. FIG. 8 is an X-Y sectional view of FIG. 7. FIG. 9 is an X-Z sectional view of FIG. 7.

The nonvolatile semiconductor memory device according to the present embodiment is provided, for example, with a stack 60 where a plurality of insulating layers 44 and control gate electrodes 18 are alternately stacked on a silicon substrate 50.

Then, for example, there is provided a hole penetrating the stack 60 from its top to the lowermost control gate electrode 18. The block insulating film 16 is provided on the side surface of the hole, and the charge storing layer 14 is provided on the inner surface of the block insulating film 16.

Further, the tunnel insulating film 12 is provided on the inner surface of the charge storing layer 14. Moreover, the columnar semiconductor layer 10 is formed on the inner surface of the tunnel insulating film 12. It should be noted that the semiconductor layer 10 is not necessarily in the columnar shape, but may be in a film shape, for example.

In other words, there is provided the semiconductor layer 10 provided as opposed to a plurality of control gate electrodes 18. Then, the tunnel insulating film 12, the charge storing layer 14 and the block insulating film 16 are provided between the semiconductor layer 10 and the control gate electrode 18.

In each of FIGS. 7 and 9, a region surrounded by a dashed line is one memory cell. The memory cell has a structure in which the tunnel insulating film 12, the charge storing layer 14 and the block insulating film 16 are formed between the semiconductor layer 10 and the control gate electrode 18.

The charge storing molecule 25 in the charge storing layer 14 is an organic molecule including the molecular structure described by the molecular formula (1). The charge storing molecule 25 may be chemically bonded to either the semiconductor layer 10 side or the control gate electrode 18 side via a linker in the molecular formula (1). For example, it is possible to form a configuration where the charge storing molecule 25 is chemically bonded to the tunnel insulating film 12 via a linker. Further, for example, it is possible to form a configuration where the charge storing molecule 25 is chemically bonded to the block insulating film 16 via a linker.

It is to be noted that the three-dimensional structure of the present embodiment can be manufactured by applying the known method for manufacturing a nonvolatile semiconductor memory device with a three-dimensional structure.

According to the present embodiment, similarly to the first embodiment, it is possible to realize a nonvolatile semiconductor memory device that accomplishes excellent charge retention properties. Further, according to the present embodiment, the memory cell is made three-dimensional, to increase the integration degree of the memory cell, thereby allowing realization of a nonvolatile semiconductor memory device with a higher integration degree than those of the first to third embodiments.

EXAMPLE

In the following, an example will be described.

Example

A transistor element with four terminals were produced by the following method.

A p-type silicon substrate was patterned by a photoresist and phosphorus ions are implanted, to form an n-type region. Subsequently, a silicon oxide film was formed on a channel region in a thermal oxidization furnace. A film thickness of the silicon oxide film was about 5 nm as a result of measuring the film thickness.

A substrate formed with the silicon oxide film was introduced to an atomic layer deposition (ALD) device, and an aluminum oxide film was formed for just one cycle, to form a tunnel insulating film made up of a stacked film of the silicon oxide film and the aluminum oxide film.

The substrate formed with the tunnel insulating film was cleaned by irradiation of the surface of the formed aluminum oxide film by a UV cleaner for ten minutes. The cleaned substrate was soaked into a solution obtained by dissolving molecules having the molecular structure of the above molecular formula (5) into a methanol mixed with 0.25 mM of tetramethylammonium hydroxide with a concentration of 0.5 mM, and allowed to stand during a whole day and night.

Thereafter, the substrate was removed from the solution and transferred into pure methanol, and then rinsed while being stimulated by an ultrasonic cleaner for one minute. It is to be noted that this rinsing operation by means of methanol was performed twice in total as methanol was replaced by a new one. Thereafter, the substrate rinsed by methanol was transferred into pure ethanol, rinsed while being stimulated by the ultrasonic cleaner for a minute, and then dried using an air duster, to form a charge storing monomolecular film made up of molecules having the molecular structure of the molecular formula (5).

Next, the substrate was introduced to a thermal ALD device, to form a block insulating film of hafnium oxide on the charge storing monomolecular film at 150° C. A film thickness of the block insulating film of hafnium oxide was set to about 10 nm.

Subsequently, it was introduced to the RTA device, and annealed under a $N_2$ gas atmosphere mixed with 3% of $H_2$ at 300° C. for 30 minutes, and nickel with a thickness of about 100 nm was stacked on hafnium oxide by an electron beam (EB) deposition device. A deposited nickel film was patterned by a photoresist to be left only in a channel region, thereby forming a gate electrode.

Next, a source-drain unit linked to the channel region was patterned by a photoresist and wet-etched by buffered hydrofluoric acid, to expose the silicon surface. Aluminum with a thickness of about 100 nm was deposited on the surface, to form a source-drain electrode. Further, the rear surface of the substrate was wet-etched and cleaned, and aluminum with a thickness of about 200 nm was deposited, to form a substrate electrode, thereby producing a transistor element made up of four terminals of the gate, source, drain and the substrate.

Comparative Example

A transistor element was produced in a similar manner to the example except that a block film of hafnium oxide was formed directly on a tunnel film without using molecules.

A voltage of 14 V was written into the gate electrode of the transistor element in each of the example and the comparative example by spending the time of 100 ms, and a threshold voltage shift generated thereby was read, to perform tracing with respect to the elapsed time. It is to be noted that the reading was performed by constantly applying a source-drain voltage of 0.1 V to read a drain current obtained by applying a gate voltage of 0 V to 6 V, and a voltage obtained upon flowing of a drain current of $1 \times 10^{-7}$ A was taken as a threshold voltage.

Figure 10:
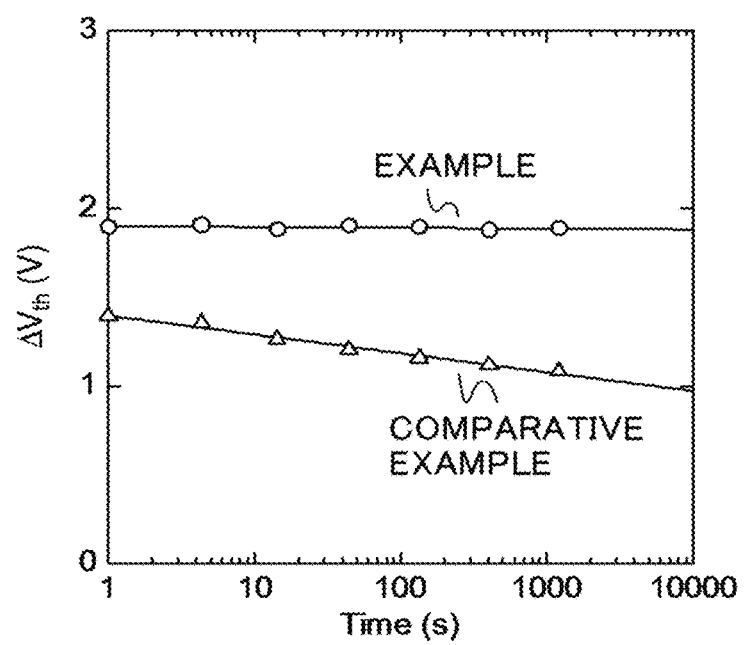
FIG. 10 is a diagram showing charge retention properties in an example and a comparative example.

FIG. 10 is a diagram showing charge retention properties in the example and the comparative example. It shows a change in threshold voltage shift with time.

Time required for 5% attenuation of an initial threshold voltage shift value have been calculated from FIG. 10. The calculation has been performed by first-order logarithmically approximation. The calculated time in the example was about $9.97 \times 10^{12}$ years and that in the comparative example was about 4.54 seconds. It was thus found that the charge storage time in the example is longer and more excellent.

From the above result, it is possible to obtain the charge storage time of not shorter than 10 years by use of the charge storing monomolecular film of the present disclosure, and its industrial value is enormous.

While certain embodiments have been described, these embodiments have been presented by way of example only, and are not intended to limit the scope of the inventions. Indeed, the nonvolatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a semiconductor layer;
   a control gate electrode; and
   an organic molecular layer provided between the semiconductor layer and the control gate electrode, the organic molecular layer having an organic molecule including a molecular structure described by formula (1):

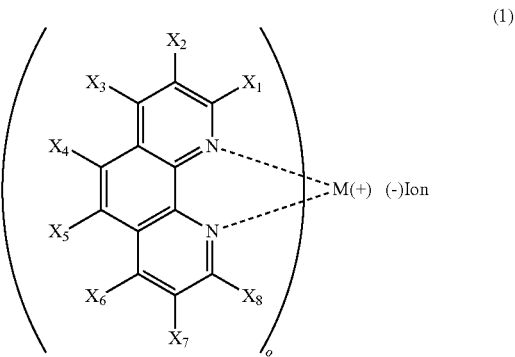

wherein
M(+) in formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion and a platinum ion, o is an integer which is not smaller than 1 and changes in accordance with the metal ion, $X_1$ to $X_8$ are independently a chemical modified group or a chemical structure, where at least one of $X_1$ to $X_8$ is a chemical modified group that chemically bonds the organic molecule to a material at a semiconductor layer side or a control gate electrode side, and (−) Ion is a negatively charged ion selected from the group consisting of a chlorine ion, a bromide ion, a triflate ion, a perchlorate ion, a hexafluorophosphate ion and tetrafluoroboron ion.

2. The device according to claim 1, wherein
the chemical modified group comprises a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group, and the chemical structure is selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a phosphonic acid, a sulfonic acid, an amino acid, a carboxyl group, a thiol group, an alkyl group, a halogen group, and hydrogen.

3. The device according to claim 1, wherein the organic molecular layer is a monomolecular film.

4. The device according to claim 1, wherein the organic molecule includes a molecular structure described by formula (2),

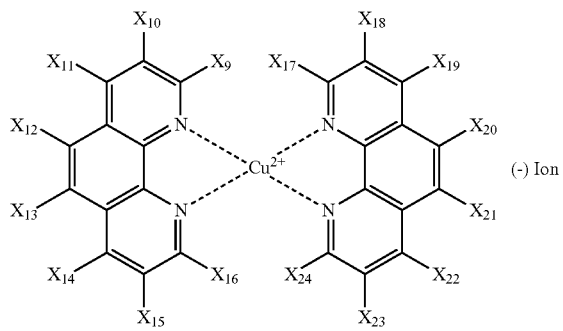

(2)

in which $X_9$ to $X_{24}$ are independently a chemical modified group or a chemical structure, where at least one of $X_9$ to $X_{24}$ is a chemical modified group that chemically bonds the organic molecule to the material at the semiconductor layer side or the control gate electrode side, and (−) Ion is a negatively charged ion selected from a group consisting of a chlorine ion, a bromide ion, a triflate ion, a perchlorate ion, a hexafluorophosphate ion and tetrafluoroboron ion.

5. The device according to claim 1, wherein the organic molecule includes a molecular structure described by formula (3),

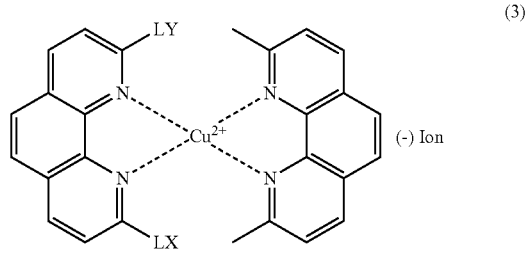

(3)

in which LX and LY are independently a chemical modified group or a chemical structure, where at least one of LX and LY is a chemical modified group that chemically bonds the organic molecule to the material at the semiconductor layer side or the control gate electrode side, and (−) Ion is a negatively charged ion selected from a group consisting of a chlorine ion, a bromide ion, a triflate ion, a perchlorate ion, a hexafluorophosphate ion and tetrafluoroboron ion.

6. The device according to claim 1, wherein the organic molecule includes a molecular structure described by formula (4),

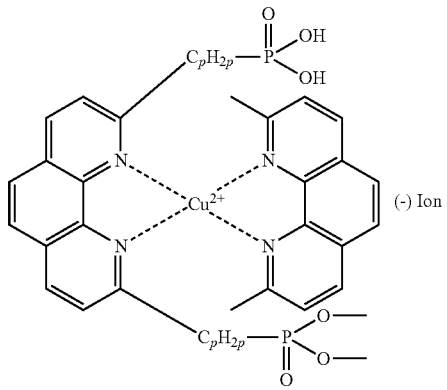

(4)

in which p is an integer not smaller than 0, and (−) Ion is a negatively charged ion selected from a group consisting of a chlorine ion, a bromide ion, a triflate ion, a perchlorate ion, a hexafluorophosphate ion and tetrafluoroboron ion.

7. The device according to claim 1, wherein the organic molecule includes a molecular structure described by a molecular formula (5),

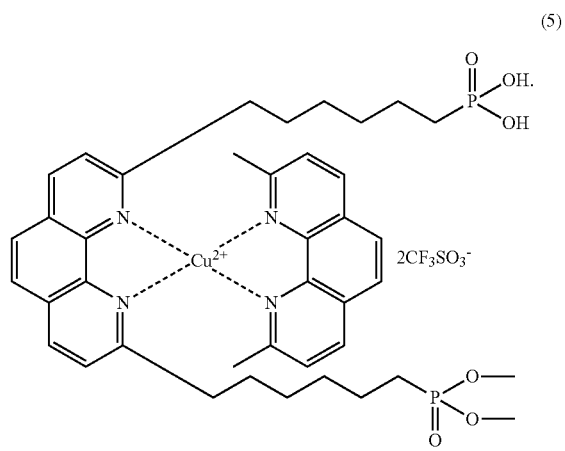

(5)

8. The device according to claim 1, wherein the organic molecule includes a molecular structure described by formula (6),

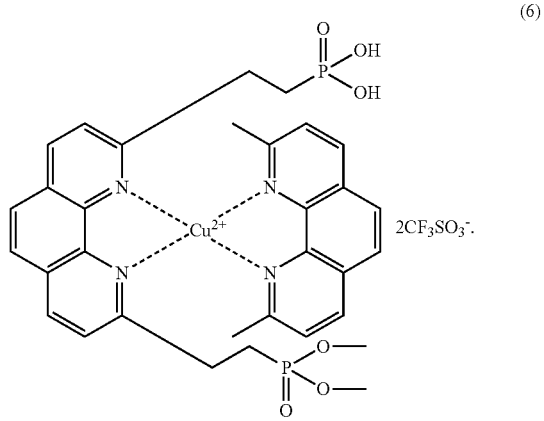

(6)

9. The device according to claim 1, wherein the organic molecule includes a molecular structure described by formula (7),

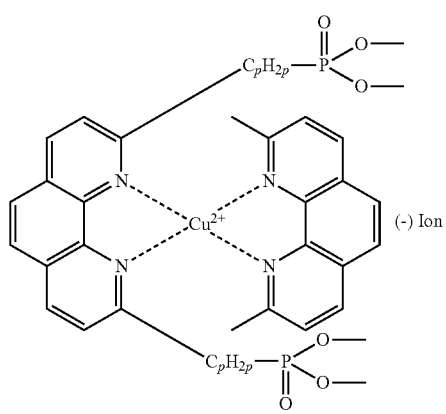

(7)

in which p is an integer not smaller than 0, and (−) Ion is a negatively charged ion selected from a group consisting of a chlorine ion, a bromide ion, a triflate ion, a perchlorate ion, a hexafluorophosphate ion and tetrafluoroboron ion.

10. The device according to claim 1, wherein the organic molecule includes a molecular structure described by formula (8),

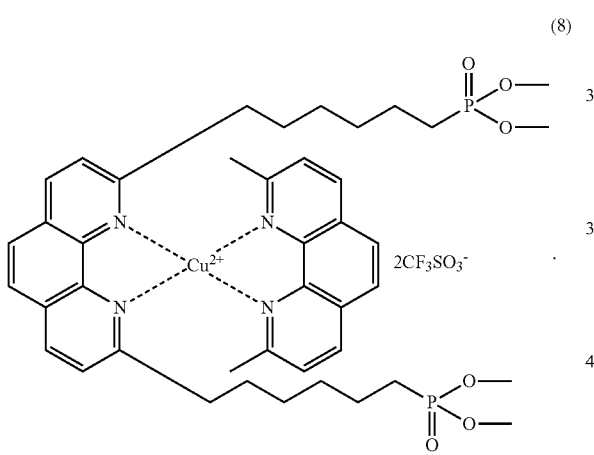

(8)

11. The device according to claim 1, wherein the organic molecule includes a molecular structure described by formula (9),

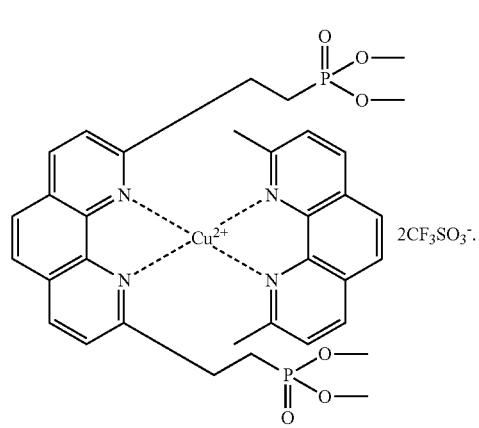

(9)

12. The device according to claim 1, further comprising a block insulating film provided between the organic molecular layer and the control gate electrode.

13. The device according to claim 12, wherein the block insulating film contains at least one metal oxide selected from a group consisting of hafnium oxide, aluminum oxide, silicon oxide, zirconium oxide and titanium oxide.

14. The device according to claim 1, further comprising a tunnel insulating film provided between the semiconductor layer and the organic molecular layer.

15. The device according to claim 14, wherein the tunnel insulating film contains a silicon oxide film or an aluminum oxide film.

16. A nonvolatile semiconductor memory device, comprising:
a stacked structure having insulating layers and control gate electrode layers, the insulating layers and the control gate electrode layers being alternately stacked;
a semiconductor layer provided opposed to one of the control gate electrodes; and
an organic molecular layer provided between the semiconductor layer and the one of the control gate electrodes, the organic molecular layer having an organic molecule including a molecular structure described by formula (1):

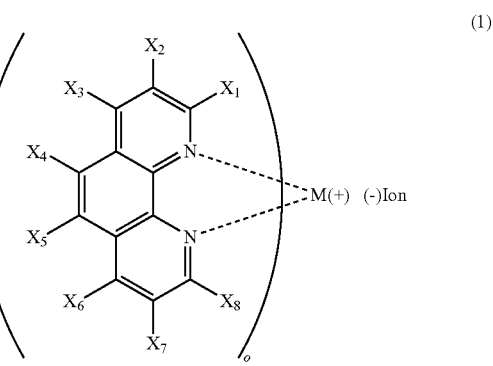

(1)

wherein
M(+) in formula (1) is a positively charged metal ion selected from the group consisting of a copper ion, an iron ion, a ruthenium ion, a cobalt ion, an iridium ion, a manganese ion, a vanadium ion, a titanium ion, a zirconium ion, a silver ion and a platinum ion,
o is an integer which is not smaller than 1 and changes in accordance with the metal ion,
$X_1$ to $X_8$ are independently a chemical modified group or a chemical structure, where at least one of $X_1$ to $X_8$ is a chemical modified group that chemically bonds the organic molecule to a material at a semiconductor layer side or a control gate electrode side, and
(−) Ion is a negatively charged ion selected from the group consisting of a chlorine ion, a bromide ion, a triflate ion, a perchlorate ion, a hexafluorophosphate ion and tetrafluoroboron ion.

17. The device according to claim 16, wherein
the chemical modified group comprises a group selected from the group consisting of an ether group, a silyl ether group, a dimethylsilyl ether group, a diethylsilyl ether group, a carboxy ester group, a sulfonyl ester group, a phosphonic acid ester group, an amide group, a thioether group, an ester group and a thioester group, and
the chemical structure is selected from the group consisting of a hydroxyl group, a hydroxysilyl group, a trimethoxysilyl group, a diethylmethoxysilyl group, a triethoxysilyl group, a dimethylethoxysilyl group, a diethylethoxysilyl group, a trichlorosilyl group, dimethylchlorosilyl group, a diethylchlorosilyl group, a phosphonic acid, a sulfonic acid, an amino acid, a carboxyl group, a thiol group, an alkyl group, a halogen group, and hydrogen.

18. The device according to claim 16, wherein the organic molecular layer is a monomolecular film.

19. The device according to claim 16, further comprising a block insulating film provided between the organic molecular layer and the one of the control gate electrodes.

20. The device according to claim 16, further comprising a tunnel insulating film provided between the semiconductor layer and the organic molecular layer.

* * * * *